US007609305B2

(12) United States Patent
Fainstain et al.

(10) Patent No.: US 7,609,305 B2
(45) Date of Patent: Oct. 27, 2009

(54) METHODS AND SYSTEMS FOR ANTI SHADING CORRECTION IN IMAGE SENSORS

(75) Inventors: Eugene Fainstain, Netania (IL); Shlomo Polonsky, Modi'in (IL); Miriam Fraenkel, Haifa (IL); Yoav Lavi, Raanana (IL)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 802 days.

(21) Appl. No.: 11/101,195

(22) Filed: Apr. 6, 2005

(65) Prior Publication Data

US 2005/0225807 A1 Oct. 13, 2005

Related U.S. Application Data

(60) Provisional application No. 60/560,298, filed on Apr. 6, 2004.

(51) Int. Cl.
*H04N 9/64* (2006.01)
*H04N 5/225* (2006.01)

(52) U.S. Cl. ...................... 348/251; 348/335
(58) Field of Classification Search ................ 348/241, 348/251, 222.1, 335
See application file for complete search history.

(56) References Cited

U.S. PATENT DOCUMENTS

| | | | |
|---|---|---|---|
| 5,920,656 A | 7/1999 | Gahang | |
| 6,008,511 A | 12/1999 | Tokumitsu et al. | |
| 6,067,088 A | 5/2000 | Tanioka et al. | |
| 6,122,406 A | 9/2000 | Okubo | |
| 6,195,469 B1 * | 2/2001 | Nishioka et al. | 382/274 |
| 6,518,640 B2 | 2/2003 | Suzuki et al. | |
| 6,690,049 B2 | 2/2004 | Suzuki et al. | |
| 6,833,862 B1 * | 12/2004 | Li | 348/207.99 |
| 7,391,450 B2 * | 6/2008 | Pinto et al. | 348/251 |
| 7,408,576 B2 * | 8/2008 | Pinto et al. | 348/251 |
| 2004/0032952 A1 * | 2/2004 | Pinto et al. | 380/54 |

OTHER PUBLICATIONS

Gennadiy Agranov et al., Crosstalk and Microlens Study in a Color CMOS Image Sensor, *IEEE Transactions on Electron Devices*, vol. 50, No. 1, Jan. 2003, pp. 4-11.
*Image Sensors—Anatomy of a Digital Camera: Image Sensors*, http://www.extremetech.com/article2/0,1558,1158540,00.asp, Jun. 12, 2001, 32 pages.

* cited by examiner

*Primary Examiner*—Jason Chan
*Assistant Examiner*—Nicholas G Giles
(74) *Attorney, Agent, or Firm*—Harness, Dickey & Pierce, P.L.C.

(57) ABSTRACT

Embodiments of the current invention provide for systems and methods for correcting shading effects in image sensors. More specifically, but not by way of limitation, embodiments of the current invention provide methods and systems for dynamically correcting shading effects for digitally converted outputs from individual pixels on a pixel array in the image sensor, wherein the shading correction may be calculated according to a function of an elliptical-type equation from the radial location of the pixel on the pixel array. In embodiments of the present invention, the correction is performed at the Bayer domain before demosaicing processing to provide for accuracy of shading correction and low power consumption.

28 Claims, 11 Drawing Sheets

METHODS AND SYSTEMS FOR ANTI SHADING CORRECTION IN IMAGE SENSORS

CROSS-REFERENCE TO RELATED APPLICATIONS

This application claims priority under 35 U.S.C. § 119 and/or 120 to U.S. Provisional Application No. 60/560,298 filed on Apr. 6, 2004.

BACKGROUND OF THE INVENTION

This disclosure relates in general to correcting shading effects in an image sensor. More specifically, but not by way of limitation, this disclosure relates to dynamically correcting digitally converted outputs from pixels in the image sensor for shading effects at a Bayer domain using correction functions of elliptical-type or circular-type equations and pixel position on a pixel array in the image sensor to ascertain a correction factor for shading effects before the output from the image sensor is interpolated and/or converted to a standard video format.

In an image sensor light entering the image sensor through a lens is never truly collimated. As a consequence image sensors, including CMOS image sensors, suffer from a phenomenon known as "shading." Shading originates from the fact that light detected by photo-sensitive elements in the image sensor that are remote from the center of the image sensor array is obliquely incident upon the remote photo-sensitive elements, whereas the light detected by photo-sensitive elements at the center of the image sensor array is substantially perpendicularly incident upon the central photo-sensitive elements. As a consequence, the light incident on the remote photo-sensitive elements may not completely fall on the remote photosensitive elements and/or may be shaded from the remote photosensitive elements by structures in the image sensor. As such, to obtain a true or at least a more accurate representation of an object from the image sensor it is necessary to compensate the outputs of the photo-sensitive elements in different locations on the image sensor array for the variable shading effect. However, shading corrections made after color interpolation, demosaicing and/or video standardization may be complicated because raw output data from pixels may be lost and more image data may now be associated with the differently shaded pixels on the image sensor. Further, shading approximation measurements found from testing of the image sensor are often not practicable to apply to pixel outputs because of the large memory necessary to store such data and the associated power requirements necessary for operating such a large memory. It is, therefore, desirable to have a shading correction method and/or system that can accurately correct shading for pixels that does/do not require large amounts of memory

BRIEF DESCRIPTION OF THE DRAWINGS

The present disclosure is described in conjunction with the appended figures.

Figure 1:
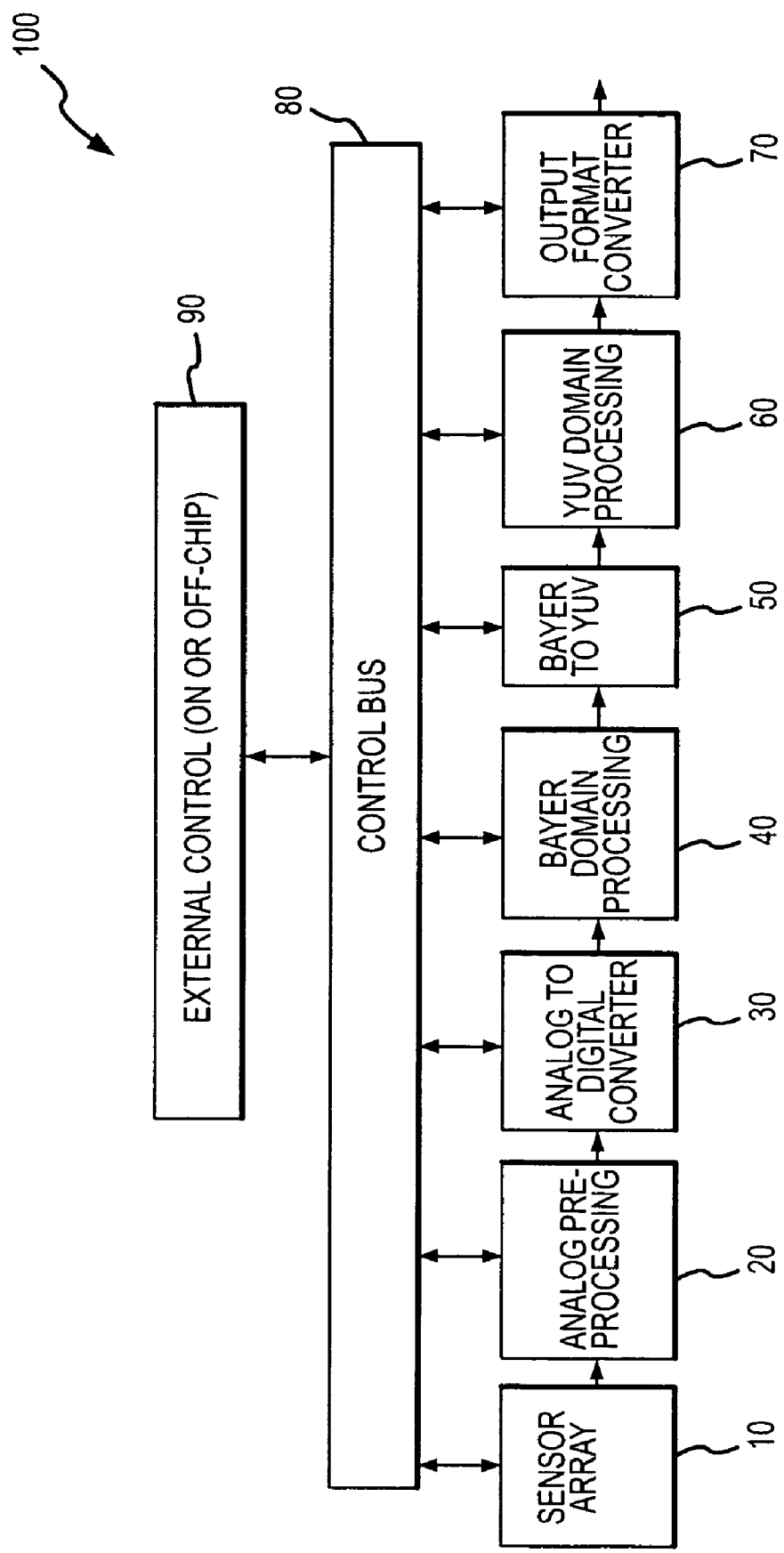
FIG. 1 is a block diagram depicting image processing in a CMOS image sensor.

In the appended figures, similar components and/or features may have the same reference label.

DETAILED DESCRIPTION OF THE INVENTION

The ensuing description provides preferred exemplary embodiment(s) only and is not intended to limit the scope, applicability or configuration of the invention. Rather, the ensuing description of the preferred exemplary embodiment(s) will provide those skilled in the art with an enabling description for implementing a preferred exemplary embodiment of the invention. It being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but the process could have additional steps not included in the figure. A process may correspond to a method, a function, a procedure, a subroutine, a subprogram, etc. When a process corresponds to a function, its termination corresponds to a return of the function to the calling function or the main function.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as a storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The current invention provides for systems and methods for correcting shading effects in image sensors. More specifically, but not by way of limitation, embodiments of the current invention may provide methods and systems for dynamically correcting shading effects for digitally converted outputs from individual pixels on a pixel array in the image sensor, wherein the shading correction is calculated from functions of elliptical-type or circular-type equations using the radial location of the pixel on the pixel array. In embodiments of the present invention, the correction may be performed at the Bayer domain before demosaicing processing. Performing shading correction at the Bayer domain may provide for accuracy of shading correction and reduced power consumption.

References suggest shading correction techniques involving measuring shading effects for pixels on a pixel array and storing correction factors in look up tables or other forms of memory. However, the storage of the correction factors requires large amounts of power and silicon area and adding to the power consumption. Further, if only representative correction values for each group of neighboring pixels are stored, less memory is needed, but the accuracy is degraded, causing poor image quality. Moreover, obtaining additional responses from pixels—such as obtaining a response from the pixels to a common illumination: (a) in a process of device calibration, (b) shortly before obtaining the imaging response; or (c) shortly after obtaining an imaging response from the pixels—adds an additional step to the imaging process complicating the process and increasing the cost of the image sensor device.

Further references suggest correcting shading effects in images from image sensors after the images have been demosaiced and converted to a standard video format, such as YUv. In demosaicing outputs from pixels at the Bayer domain are converted to an RGB-per-pixel representation, where R=Red, G=Green and B=Blue. Missing color components for each pixel are calculated from the outputs of neighboring pixels. The shading effect is wavelength dependant. Consequently, after demosaicing, each R, G, B component for each pixel will be determined from a mix of pixel outputs at the Bayer domain. The mix of pixel outputs determining the R, G, B components for a single pixel are from pixels that may be responsive, because of color filters associated with the pixels, to different illumination wavelengths and, thus, the different pixels will suffer from different shading effects. As such, precise correction of shading effects after demosaicing is not possible and approximations must be taken. Even if demosaicing is performed linearly so that each Y, U, V is calculated as a linear combination of R, G, B color components, the shading effect may be calculated but, because each component has a different shading degradation, correction at this stage is much more complex.

From observation and study of the shading phenomena, it may be seen that shading effects in image sensors may be somewhat circular or elliptical in nature such that for pixels lying on an ellipse that is centered on a center of the pixel array the shading effect is substantially similar. From this observation, it may be shown that, using two-dimensional cartesian coordinates, where $(X_0, Y_0)$ are the coordinates of a center of the pixel array, the amount of light energy for pixel at coordinates (X, Y) equals:

$$P(X, Y) = P(X_0, Y_0) * F\left(\sqrt{\frac{(X-X_0)^2}{S^2} + \frac{(Y-Y_0)^2}{T^2}}\right) \quad (1)$$

where $\frac{(X-X_0)^2}{S^2} + \frac{(Y-Y_0)^2}{T^2}$ is an elliptical-type equation.

In such an elliptical equation, an ellipse is defined that has two radial components about the center point $(X_0, Y_0)$—an x radius and a y radius—and, as such, the function F of the ellipse type equation varies radially about the center point of the ellipse $(X_0, Y_0)$ according to the ellipse equation.

It may also be possible in some embodiments of the present invention to identify shading effects using a function of a circle equation, i.e., $(x-h)^2+(y-k)^2=r^2$. A function of a circle type equation will vary radially like an ellipse type equation, however, with a function of a circle type equation the radial variance is the same for the x and the y components.

According to Equation (1), the light energy at different locations on the pixel array is a function F of the elliptical-type equation and varies with radial pixel location relative to the center of the pixel array where the radius defines an ellipse with different vertical and horizontal attributes. In Equation (1), for a pixel array in an image sensor, S and T are constants that may depend upon the magnitude of the physical dimensions of the pixel array. Further, function F is wavelength specific and different variations of function F must be used to ascertain shading for pixels associated with different incident wavelengths. In an image sensor utilizing red, green and blue color filters with the pixels in the image sensor, three different variations of function F must be used to determine shading factors for pixels associated with the red filters, shading factors for the pixels associated with the green filters and shading factors for the pixels associated with the blue filters. While this may be complex the correction factors produced will be more accurate than correction factors derived from correction methods that do not take wavelength effects into account.

From Equation (1) it can be shown that after the shading effect received by a pixel at location (X, Y) is $E_{xy}$, the shading compensated energy $E'_{xy}$ is:

$$E'_{X,Y} = \frac{E_{X,Y}}{F\left(\sqrt{\frac{(X-X_0)^2}{S^2} + \frac{(Y-Y_0)^2}{T^2}}\right)} \quad (2)$$

By defining:

$$A = S^2/T^2 \quad (3)$$

Equation (2) becomes:

$$E'_{X,Y} = \frac{E_{X,Y} * S}{F\left(\sqrt{(X-X_0)^2 + A*(Y-Y_0)^2}\right)} \quad (4)$$

Now defining:

$$R = \sqrt{(X-X_0)^2 + A*(Y-Y_0)^2} \quad (5)$$

The shading correction factor that is multiplied by the sensed pixel energy to correct for shading is a function $F_1$ of R and may be represented as:

$$E'_{X,Y} = E_{X,Y} * F_1(R) \quad (6)$$

Or may be represented as a second function $F_2$ so that:

$$E'_{X,Y} = E_{X,Y} * F_2(R^2) \quad (7)$$

Because of the dependence of the constants in the functions on the wavelength of the light incident upon the pixels, $F_1$ and $F_2$ may be defined separately for each color component of the pixel array. As persons of skill in the art may ascertain, different definition of functions $F_1$ and $F_2$ are necessary for pixels associated with red filters in the image sensor compared to pixels associated with green color filters in the image sensor.

In embodiments of the current invention, outputs from each of the pixels in an image sensor may be corrected for shading using either equations (6) or (7), or by using a close approximation of either equations (6) or (7) such as a circle-type equation, and applying the radial location of a pixel to either of the equations to process an output of the equations for the pixel. As may be seen from the equations, the shading effect varies radially across the pixel array where the radial variation is elliptical in nature. In certain embodiments of the present invention the radial location of the pixel is determined relative to a center of the pixel array and described in cartesian coordinates and applied to the equations (6) and (7) to determine a shading correction factor for the pixel. In such embodiments and in alternative embodiments where other methods of solving the equations for individual pixels may be used, shading correction factors may be directly evaluated for a pixel on the pixel array using the pixel's radial location relative to a center of the pixel array. In other embodiments of the present invention, shading correction factors may be determined iteratively by calculating the differences of R or $R^2$ between neighboring pixels. In either of these embodiments, power is saved because the correction factors may be determined dynamically without requiring the use of large look up tables or large memory devices.

FIG. 1 is a block diagram depicting typical image processing in a CMOS image sensor. In a CMOS image sensor 100, a sensor array 10 comprising a plurality of pixels converts an image that is incident upon the CMOS image processor 100 into a plurality of analog voltages, where each pixel on the sensor array 10 outputs an analog voltage in response to the light incident on the pixel from the image. An analog pre-processor 20, among other analog processing functions, may correct the offset and gain variations for each of the pixel outputs. The pre-processed analog outputs may then be converted by an analog to digital converter 30 to a digital form. As such, after analog to digital conversion, a digital representation of the image incident upon the CMOS image sensor 100 may be produced. This digital representation of the image is in the Bayer domain since it is in raw color data form and has not been processed to include missing color components. While the term Bayer domain is used to describe the raw color format of the digital image, the current invention may be used with image sensors using color patterns other than Bayer patterns, such as color patterns using yellow color filters, magenta color filters, and/or the like.

In Bayer domain processing 40, the digital outputs from the pixels in the sensor array 10 may be used along with the understanding of the color pattern of the color filters used with the sensor array 10, which patterns may vary between the different image sensors, to reconstruct and/or interpolate the missing color components for each pixel. Because each of the pixels on the sensor array 10 is associated with a color filter only a proportion of the red, green and blue light falling on the sensor array 10 is captured. Using demosaicing algorithms, in a process called demosaicing, the missing color components may be determined from the outputs of neighboring pixels on the sensor array 10 and an accurate color image from the sensor array 10 may be obtained. However, after demosaicing has occurred, the actual outputs from the pixels of the sensor array 10 are modified and accurate anti-shading correction is more complicated and is likely to be less accurate. Other processing of the raw image from the sensor array 10 may also be performed at this stage.

After processing at the Bayer domain 40, a Bayer to YUV converter 50 may translate the image from the Bayer domain, which may be specific to the image sensor array, to a universal video standard. In the illustrated example the universal video standard is defined as YUV video standard, however, the conversion may be to another standard video signal. Further image processing may be done in the YUV domain 60, including sharpening, white balance, filtering and similar functions. Some references also suggest processing for shading in the YUV or standardized video domain.

In a final step, the processed YU image may be converted to the desired output format by output format converter 70. Each of the components in the CMOS image processor 100 may be controlled by a control bus 80 that may program the processing parameters of the various units and govern the timing of the selection and processing of the inputs and outputs of the components. For example, the control bus 80 may control the scanning of outputs from the pixels on the sensor array that may in turn be processed to form the output image from the CMOS image processor 100. Control bus 80 may comprise one or more conductors or optical fibers that serve as a common connection for the components of the CMOS image processor 100 and the related image processing components. Control bus 80 may be controlled by an external control unit 90. The external control unit may be a processor or processors, a processor component or software capable of being executed by a processor, and/or the like and may be incorporated on chip with the sensor array 10, etc, or it may located off chip as an independent device.

In an embodiment of the present invention, shading correction may be performed as part of Bayer domain processing 40. In the embodiment, shading correction may be performed on the digitally converted outputs of the pixels in the sensor array 10 at the Bayer domain, prior to demosaicing. The correction may be made dynamically according to essentially real-time calculations of shading correction factors without the need to resort to look up tables or memory storage of correction factors and without having to measure additional responses from the pixels in order to determine correction factors. The methods of the current invention comprise BAYER domain digital correction for the shading errors.

As discussed above, the correction to be applied to pixel energy at location (X, Y) is a function $F_1$ of R, where:

$$R = \sqrt{(X-X_0)^2 + A*(Y-Y_0)^2} \quad (8)$$

Or, alternatively, the correction is a function $F_{2\ of\ R^2}$, where:

$$R^2 = (X-X_0)^2 + A*(Y-Y_0)^2 \quad (9)$$

$F_1$ and $F_2$ are also functions of the color of the current pixel.

In an embodiment of the present invention, the calculation of R and/or $R^2$ may be performed iteratively based on the following equations:

$$((X+1)-X_0)^2 = (X-X_0)^2 + 2*(X-X_0) + 1 \quad (10)$$

$$((Y+1)-Y_0)^2 = (Y-Y_0)^2 + 2*(Y-Y_0) + 1 \quad (11)$$

In equations (10) and (11) the squaring operation of equations (8) and (9) is replaced by three additions. Moreover, according to the equations, the value of $2*(X-X0)$ is incremented by 2 whenever X is incremented by 1. As such, in some embodiments of the present invention, a register may be allocated to hold the value of $(2*(X-X_0)+1)$ and the value of the register may be incremented by two for every pixel on the sensor array 10 that is scanned logically across the x-axis of the sensor array 10 so that the only operations needed to obtain a correction factor for the newly scanned pixel are one increment of two and one addition.

Some image sensors provide an option to generate mirror images by reversing the scanning direction of pixels on the sensor array 10 in the X and/or the Y dimensions. For such image sensors, the above equations become:

$$((X+1)-X_0)^2 = (X-X_0)^2 \pm 2*(X-X_0) + 1 \quad (12)$$

$$((Y+1)-Y_0)^2 = (Y-Y_0)^2 \pm 2*(Y-Y_0) + 1 \quad (13)$$

Where the+or the−operations may be selected according to the scanning direction.

Figure 2A:
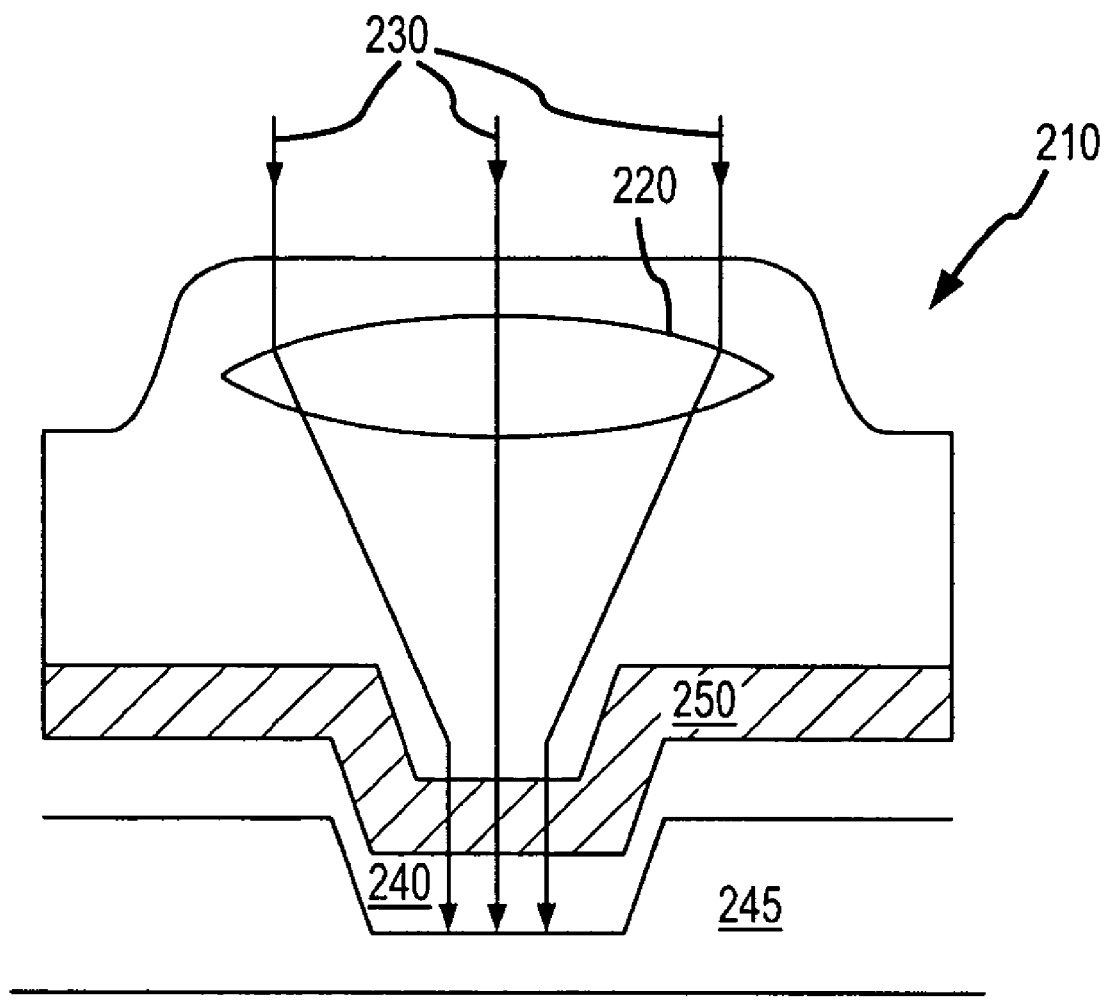
FIG. 2A illustrates basic features of a pixel in an image sensor.

FIG. 2A illustrates basic features of a pixel in an image sensor. Pixel 210 includes a microlens 220 that focuses the photons 230 incident upon the pixel 210 onto the photodiode 240. The photodiode is fabricated into a silicon substrate 245. To reach the photodiode the photons 230 must pass through a color filter 250. In general, each pixel in a pixel array is associated with either a green, blue or red filter.

Figure 2B:
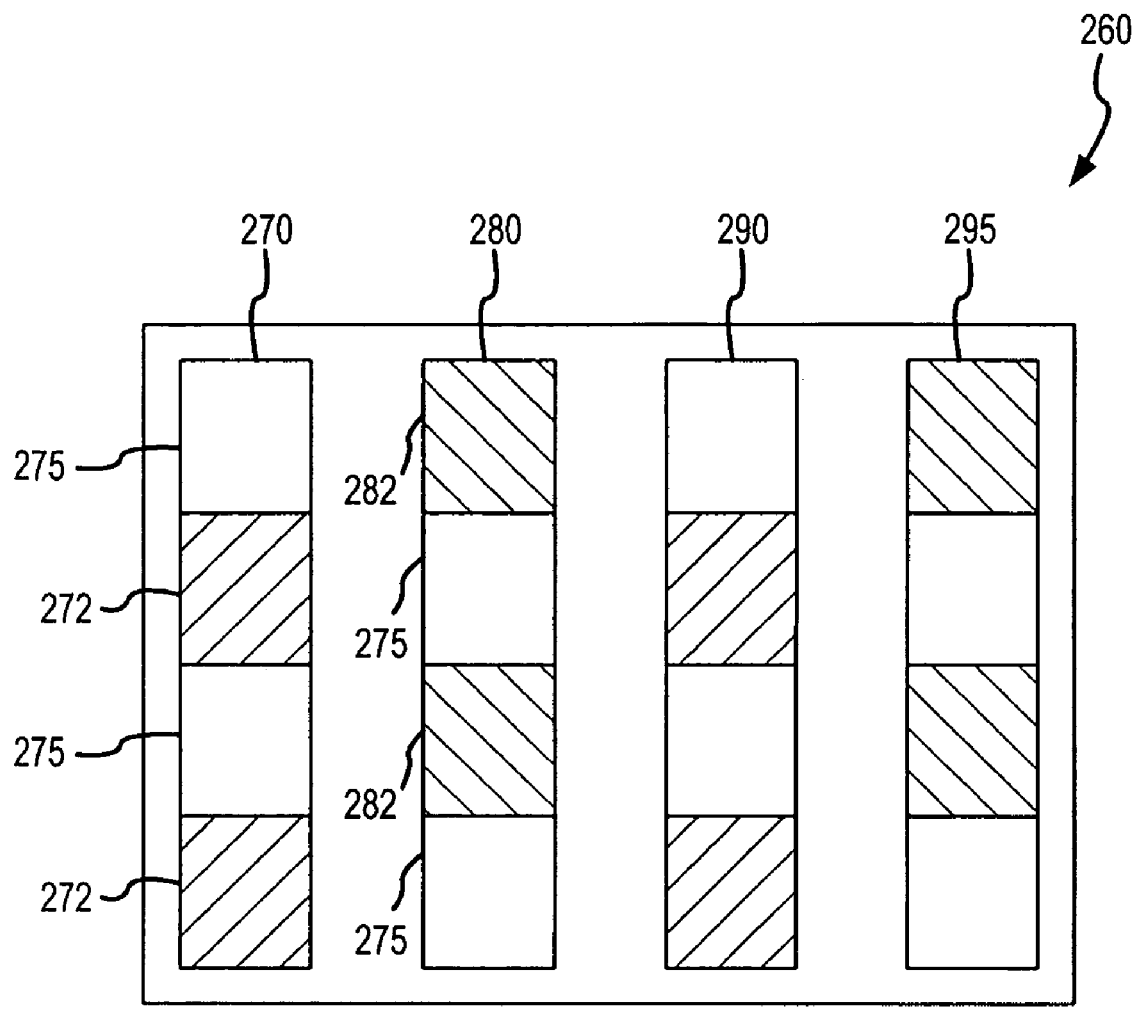
FIG. 2B illustrates distribution of color filters across a pixel array in an image sensor.

FIG. 2B illustrates distribution of color filters across a pixel array in an image sensor. In an image sensor the color filters associated with each pixel on a pixel array 260 may be arranged in a mosaic pattern. In the pixel array 260 illustrated in FIG. 2A the mosaic pattern of colored filters comprises four lines of color filters, lines 270, 280, 290 and 295. In the first line of color filters 270, red filters 272 alternate with green filters 275. In the second line of color filters, line 280 green filters 275 are alternated with blue filters 282. The resulting mosaic pattern of filters is called a Bayer pattern and includes twice as many green filtered pixels as red or blue filtered pixels because the human eye is more sensitive to green. Many other types of color filter patters exist, such as CYGM using cyan, yellow, green, and magenta filters in equal numbers.

Figure 3:
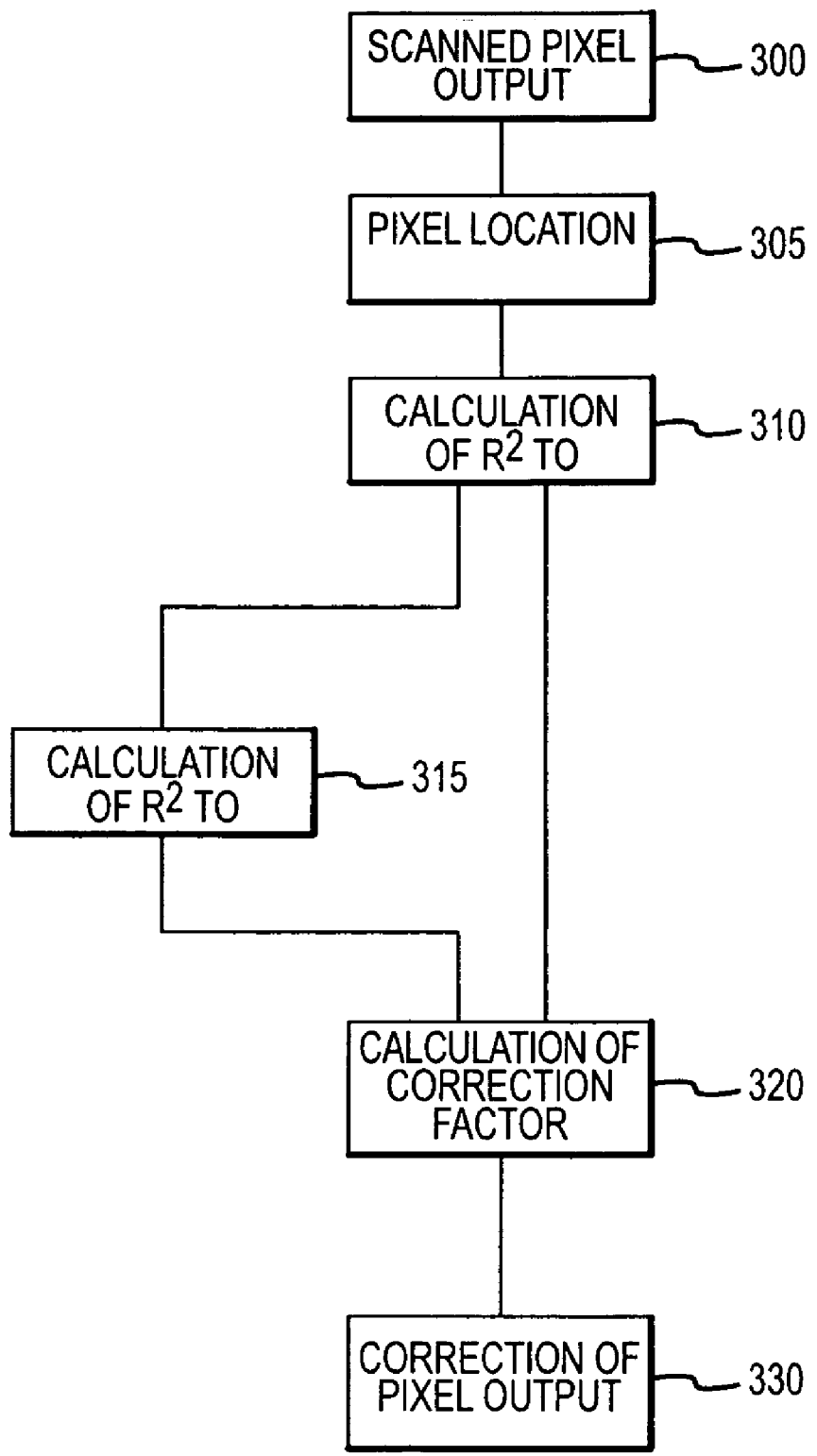
FIG. 3 illustrates a simplified flow type diagram of shading correction in accordance with an embodiment of the present invention.

FIG. 3 illustrates a simplified flow type diagram of shading correction in accordance with embodiments of the present invention. In an embodiment of the present invention, in step 300 a pixel in the image sensor is scanned and produces an output corresponding to the luminance falling upon the pixel. The output is raw and may contain shading effects that will vary depending upon the pixel location on the pixel array. In step 305, information concerning the location of the pixel on the pixel array is retrieved. The pixel array may be scanned logically so that pixel location information may involve information regarding the scanning line and the pixel location on the scanning line. In certain embodiments, pixel location information is Cartesian in format having an X and a Y value.

In certain embodiments, in step 310, X and Y values for the pixel location may be processed according to an elliptical-type equation to produce a value of $R^2$. In other embodiments, in step 315, the X and Y values may be processed according to an elliptical-type equation and then square rooted to produce a value of R. Processing may be performed by a processor either on or off the image sensor chip, by a combination of circuit components —such as multiplexers, registers, multipliers, adders, subtractors or the like, and/or similar devices. Processing may be iterative and/or use methods to approximate the value of the elliptical-type equation. In either of the embodiments, in step 320 the values of either $R^2$ or R may be applied to the relevant function—$F_1$ or $F_2$—to obtain the relevant correction factor for the pixel's output. In step 320 the selected form of function $F_1$ or $F_2$ corresponds to the wavelength transmissibility of the color lens associated with the pixel. The value of $F_1$ or $F_2$ corresponding to the value of $R^2$ or R may be found in a look up table or other memory means or may be interpolated from an abbreviated look up table or the like. Since pixels with the same radial location on an ellipse may be affected by a substantially similar shading effect, the size of a look up table is less than if the look up table stored correction factors for each of the pixels in the image sensor. Further, the use of the radial-elliptical nature of the relationship between pixels regarding shading effects provides an accurate and effective way to limit look up table size. In step 330, the shading correction factor for the scanned pixel deduced from either function $F_1$ or $F_2$ may be applied to the pixel output.

Figure 4:
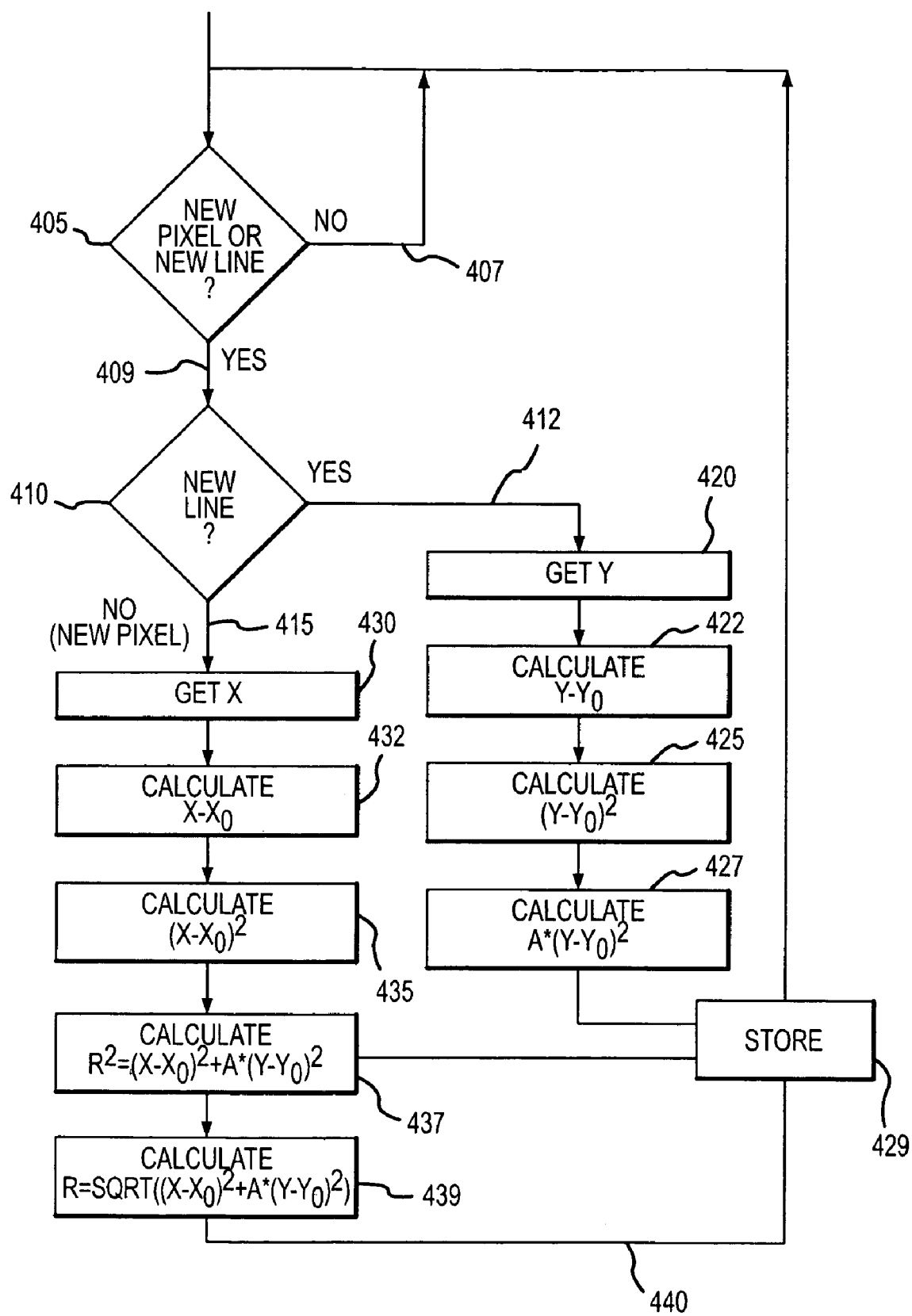
FIG. 4 is a simplified flow type diagram of an embodiment for processing shading correction factors for pixels in an image sensor array according to pixel location.

FIG. 4 is a simplified flow type diagram of an embodiment for calculating shading correction calculation for pixels in an image sensor array according to pixel location. FIG. 4 illustrates a process for scanning pixels and calculating correction factors. In some embodiments of the present invention, an image scanner may logically scan across the pixels in the image sensor array. Logical scanning may involve scanning across the image sensor array in lines so that when the image scanner reaches the end of the line it may move to a next line and scan across that line. The image sensor array may be analyzed in two dimensional Cartesian coordinates. As such each scanned line may be considered to have the same y coordinate and the scanner may scan a line with the same y coordinate along an x-axis. When the image scanner reaches an edge of the image sensor array it may move to a new y coordinate and repeat the previous process. Further, by identifying a reference point on the image array sensor the image scanner may identify relative x and y coordinates for each pixel it scans relative to the reference point. In certain aspects of the present invention the reference point may be chosen to coincide with an optical center of the image sensor array where the optical center is determined from the properties of the lens of the image sensor. In other aspects, the reference point may be the center of the image sensor array.

In the illustrated embodiment, in decision box 405 a decision is made depending upon whether an image scanner or the like has moved to a new pixel or a new line. In decision box 405 nothing will occur if neither the line-count nor the pixel-count changes, i.e., the image scanner does not scan an output from a new pixel. In this situation, the top decision junction loops through the NO terminal 407. In decision box 405 when either the line-count Y or the pixel-count X changes, i.e., a new line or new pixel is being scanned, the decision junction passes through the YES terminal 409.

Once it is determined that a new pixel or line is being scanned, in decision box 410 a determination is made concerning whether it is a new line or a new pixel that is being scanned. In aspects when a new line is scanned the YES terminal 412 of the second decision junction is selected. In the illustrated embodiment, when a new line is scanned the Y location of the pixels being scanned on the image sensor array changes relative to the reference point and as such the Y part of the correction factor may be updated. To update the shading correction equation the new value of Y is obtained in step 420. In the illustrated embodiment, $Y_0$, the Y coordinate of the reference location may be subtracted from Y in step 422. In step 425 the difference between Y and $Y_0$ calculated in step 422 may be squared. In step 427 the result from step 425 may be multiplied by A, where A is as defined above in equation (3). In certain aspects, the calculated value of $A*(Y-Y_0)^2$ may be stored in step 429 and used for further calculation of shading correction factors for pixels located on a line with the Y coordinate. Once the Y calculation has been performed the algorithm loops back to the top decision junction to wait for a change in X or another change in Y.

In aspects where a new pixel is found in decision box 410 the second decision junction for decision box 410 exits through the NO terminal 415. When a new pixel is found the X location of the pixel is obtained in step 430. Once the X location of the pixel is determined, the X coordinate of the reference location, $X_0$, may be subtracted from X in step 432 to provide the X position of the pixel relative to the reference location. In step 435 the output from step 432 may be squared. In step 437 $R^2$ may be calculated by retrieving $A*(Y-Y_0)^2$ from store 429 and adding it to the result of $(X-X_0)^2$ calculated in step 435. In step 439 R is calculated from the square root of the output of step 437. The square root may be calculated by a processor or the like or may be determined using a table.

The output of 439 provides a calculation of equation (9) for the pixel according to its X and Y location relative to a reference location that may be used to provide a shading correction factor for the pixel. Once a calculation has been dynamically performed for a scanned pixel the correction process may loop back to decision box 405 to wait for the next change in X or Y as the image sensor array is scanned. In alternative embodiments, step 439 is not performed and the correction factor for the pixel may be determined from the value for $R^2$ from step 437. In such embodiments, after $R^2$ is determined the correction process may loop back to decision box 405 to wait for the next change in X or Y as the image sensor array is scanned.

Figure 5:
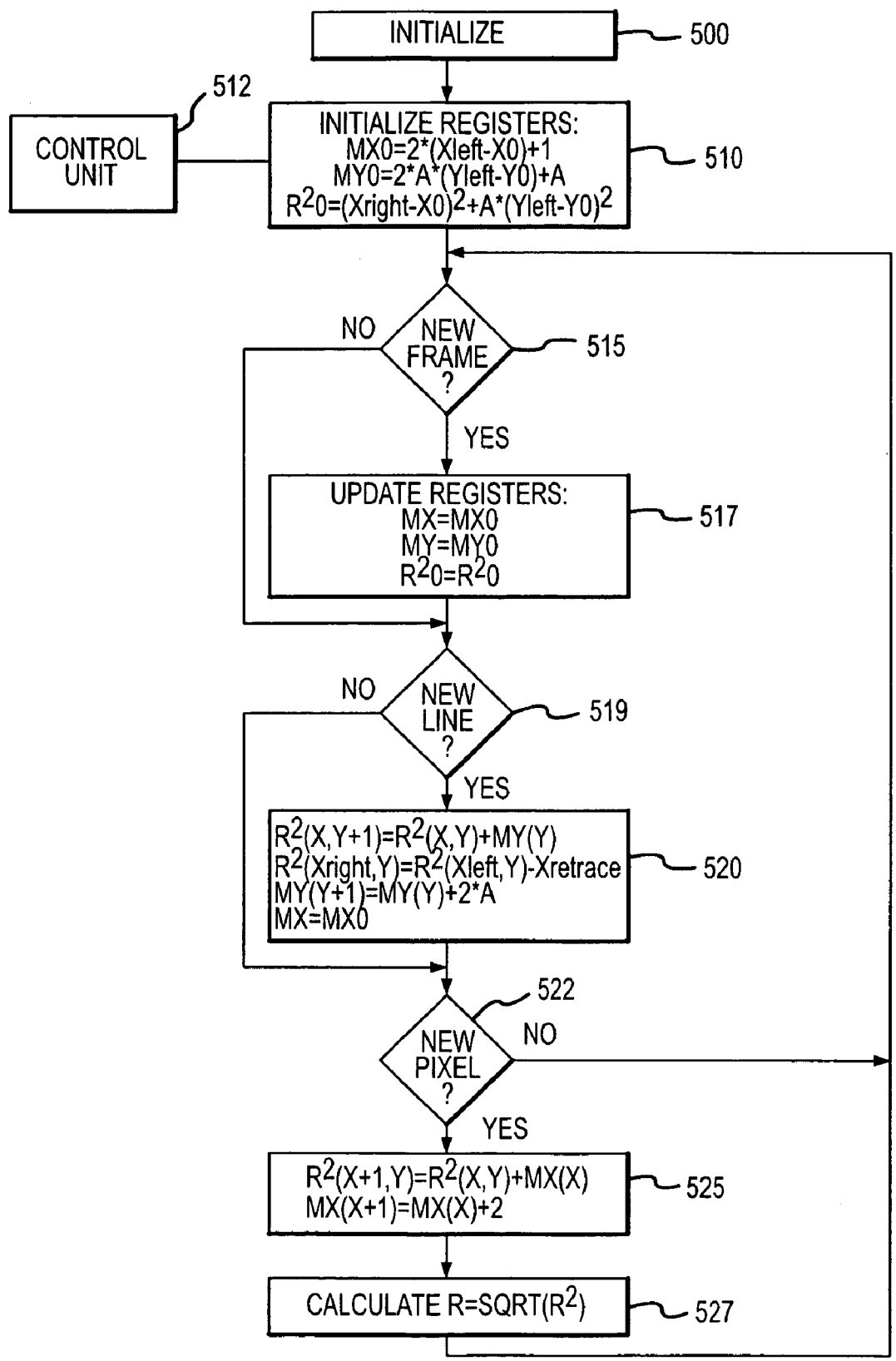
FIG. 5 is a simplified flow type diagram of an embodiment for iteratively processing shading correction factors for pixels in an image sensor array according to pixel location.

FIG. 5 is a simplified flow type diagram of an embodiment for iteratively calculating shading correction calculation for pixels in an image sensor array according to pixel location. As illustrated, the iterative calculation process is initialized in step 500. In step 510, initial values from working registers MX, MY, $R^2$ may be loaded to reference registers MX0, MY0, $R^2 0$ from a control unit 512. In the illustrated embodiment, calculations of equations (8) and (9) may be calculated for the reference location ($X_0$, $Y_0$) and loaded to reference registers MX0, MY0, $R^2 0$ from control unit 512 when the process of scanning the image sensor array is first initiated. In certain aspects, $R^2 0$ may be set to the value at the end of a first scanned line of pixels rather than the beginning of the line so that the correction for retracing from the last to the first pixel of each row, that may be performed when each new line begins, will work right for the first line as well.

In the illustrated embodiment, whenever the scanning of a new frame starts, in step 517 the working registers MX, MY and $R^2$ may be reloaded from the reference registers MX0, MY0, $R^2 0$. In step 515 if it is determined that a new frame is not being scanned the process bypasses the reloading of reference registers of step 517. In step 519 when a New Line is detected the process moves to step 520 where $R^2$ and MY are updated according to equations (10) and (11), and MX is reloaded from the reference register MX0. Further, in step 520, $R^2$ is updated for the retrace of X from the rightmost to the leftmost pixel by subtracting Xretrace=$(Xright-X0)^2-(Xleft-X0)^2$.

After processing for the scanning of a new line or if no new line is being scanned, in step 522 it is determined whether a new pixel is being scanned. If a new pixel is not detected the process returns to decision box 515 to determine if a new frame is being scanned. If a new pixel is detected in decision box 522 then registers $R^2$ and MX are updated in step 525. In step 525 an iterative calculation of equation (9) may be executed and a correction factor for the scanned pixel ascertained. In certain embodiments, at this point the process may return to decision box 515 to iteratively calculate a correction calculation for another scanned pixel or to wait for the scanning of a new frame. In other embodiments, the square root of $R^2$ is determined in step 527 and this value may be used to calculate the correction factor for the scanned pixel.

In certain embodiments of the present invention, instead of calculating the values of $F_1$ or F for pixel locations on the pixel array the values may be stored in a ROM or a RAM based table. However, in such embodiments, the use of large amounts of memory may be necessary that may provide for increased power consumption by the image sensor.

Figure 6:
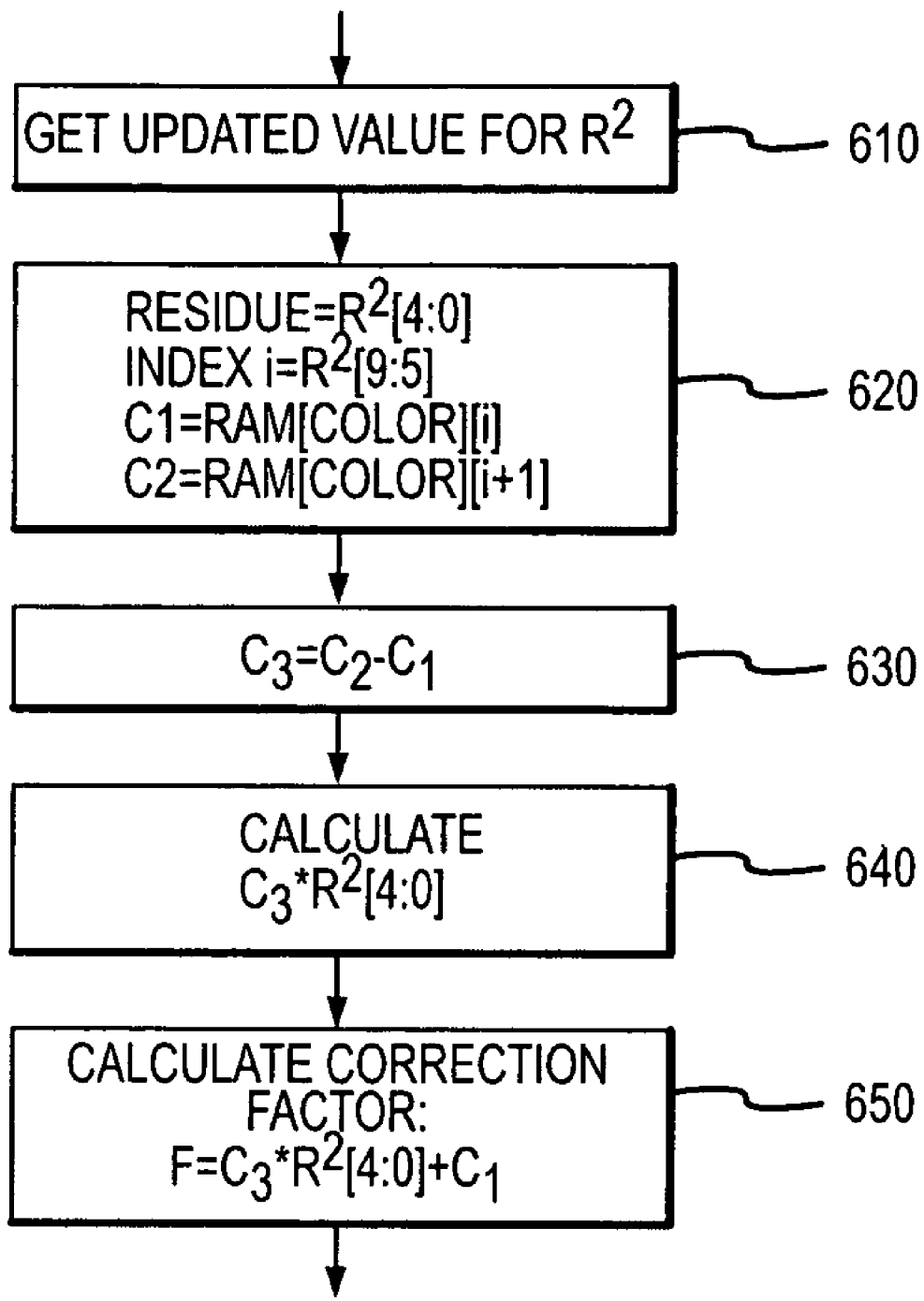
FIG. 6 illustrates a method of an embodiment for combining calculation processes and memory storage tables to calculate shading correction factors with reduced memory requirements.

FIG. 6 illustrates a method of an embodiment for combining calculation processes and memory storage tables to calculate shading correction factors with reduced memory requirements. In the embodiment illustrated in FIG. 6, $F_2$ may be approximated from a given $R^2$. In the process an updated value for $R^2$ may be obtained in step 610. In the embodiment $R^2$ is 10 bit wide. In step 620 the value of $R^2$ may be obtained from a 32 entry table for each color that may be addressed by bits [9:5] of $R^2$. The table may be accessed twice—first, for the entry below the actual $R^2$ value, C1, and second for the next entry, C2. In step 630 a value C3, which is the difference between the two entries, C2-C1, may be calculated. C3 may then be used for the interpolation of the correction factor. In step 640, C3 is multiplied by the residue of $R^2$—the part that was truncated in the entry to the table. In step 650 the correction value is calculated by adding the C1 value that was read from the table.

Figure 7A:
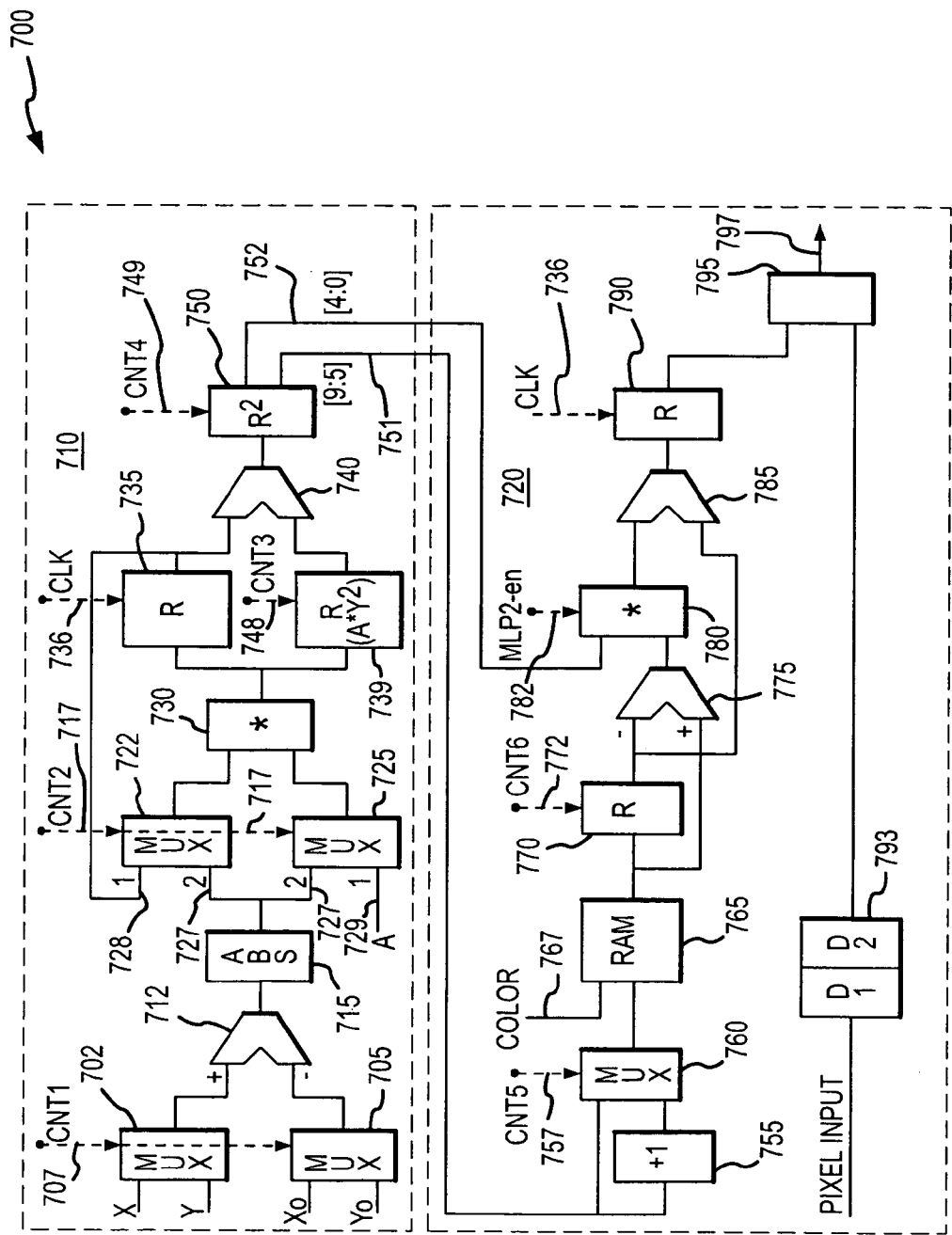
FIG. 7A illustrates a simplified block diagram of a circuit to correct shading for a pixel on a pixel array according to an embodiment of the present invention.

FIG. 7A illustrates a simplified block diagram of a circuit to correct shading for a pixel on a pixel array according to an embodiment of the present invention. In the illustrated embodiment, a complete processing circuit 700 may be divided into two separate circuits, a first circuit 710 that calculates $R^2$ and a second circuit 720 that approximates the correction function $F_2$ and then multiplies the incoming pixels by the correction factor. In certain embodiments, there may be two clock cycles for each pixel. However, different clock level frequencies may be used in different embodiments of the present invention. In the illustrated embodiment, propagation of an output to be processed through the logic and arithmetic elements may be fast relative to the clock cycle to provide for accurate correction. To prevent a loss of synchronization in the processing of pixel outputs, a set of registers, registers 735, 739, 750, 770, and 790, and a delay-line 793 may be clocked and may add a delay of at least one clock cycle. The delay of the multipliers may be more than the delay of the other elements in the circuit.

As shown in FIG. 7A, hardware units may be shared for the calculation of the X and the Y portions of $R^2$. For example, a subtractor 712, a multiplier 730, and the like may be shared in the processing of X and Y. Merely by way of illustration, the subtractor 712 may be used during the horizontal-blank period of the scanning of the pixel array to calculate the value of $Y-Y_0$ and may also be used during the line scan period of the pixel array to calculate the value of $X-X_0$, where X, Y, $X_0$ and $Y_0$ are selected by multiplexers 702 and 702 that are controlled a control CNT1 707. An output from the subtractor 712 may enter an absolute value unit 715 that may calculate $|X-X_0|$ and $|Y-Y_0|$, depending upon the scanning of the pixel array and, consequently, the output of a pair of multiplexers, multiplexers 702 and 705. In theory, the absolute value unit 715 is mathematically redundant because the difference of the location components is squared in the next operation, but practically it may be used to allow the implementation of a simpler unsigned multiplier. In alternative embodiments, signed multipliers may be used without the absolute value unit 715.

In the illustrated circuit, a multiplier 730 may be used to square an output of $X-X_0$, an output of $Y-Y_0$ and the multiplication of the output of $Y-Y_0$ by A. During the X blank period of the scanning, a CNT2 717 may be set to high to force the multiplexers 722 and 725 to select a pair of 2-inputs 727 and present the output of $|Y-Y_0|$ to both inputs of the multiplier 730 to provide for the squaring of the output of $|Y-Y_0|$. The output from the multiplexer 730, $(Y-Y_0)^2$ may be stored in a register 735. During subsequent clock cycles of the X-blank period, the CNT2 717 may go low. When the CNT2 717 goes low, the multiplexer 722 may select a 1-input 728 and present the value of $(Y-Y_0)^2$ obtained from the register 735 to one port of the multiplier 730 and the multiplexer 725 may also select its 1-input 729 and may retrieve a pre-programmed value of A from a memory device, not shown, and may present the pre-programmed A to the other port of the multiplier 730. From these inputs, the multiplier 730 may produces=an output equivalent to $A*(Y-Y_0)^2$ that may be stored in a register 739. The register 739 may be controlled by control signal CNT3 741. Since the image sensor array may be scanned in lines along the x-axis of the array, the register 739 may store the output $A*(Y-Y_0)^2$ until a new line of the image sensor array is scanned. During the time that a line of the image sensor array is being scanned the control signal CNT2 717 may be held high to control inputs to the multiplier 730 to provide that the inputs both receive an input of $|X-X_0|$. In this way, the multiplier 730 may output a square of the value of $|X-X_0|$. The output from the multiplier 730, $|X-X_0|^2$ may be stored in a register 735. The register 735 may be controlled by a regular frequency clock signal CLK 736 to provide that the stored value of the register 735 is output at a correct clock period to provide for synchronization with the circuit 720. The register 735 may present the stored value $|X-X_0|^2$ to a first input of an adder 740 and the register 739 may, in synchronicity, present the stored value $A*(Y-Y_0)^2$ to the second input of the adder 740. After receiving the inputs, the adder 740 may produce a value for the elliptical-type equation $R^2=(X-X_0)^2+A*(Y-Y_0)_2$ that may in turn be stored in the register 750 for application to the circuit 720. A control signal CNT4 749 may be provided to operate the register 750 and control the output of bits [9:5] 751 and bits [4:0] 752 from the register 750 for application to the circuit 720.

In the circuit 720 function $F_2$ may be processed. In the circuit 720 high order address bits in a RAM 765 may be driven by a color indicator bus 767 that identifies the color of the filter associated with the scanned pixel and selects the form of function $F_2$ required by the filter color—remembering that different function components are used in $F_2$ for different colors. In effect, three different look up tables are used in the RAM 765, one per color component. The RAM 765 may be accessed twice per pixel—a first time to obtain C1, using the bits [9:5] 751 of the calculated $R^2$ and a second time to obtain C2, which corresponds to the next address. To provide for this double access, a multiplexer 760 controlled by a control signal CNT5 757 may first present the calculated $R^2[9:5]$ from the register 750 to the RAM 765 and then in the next clock cycle, select an output from the incrementor 755 to provide that the RAM 755 is presented with the subsequent address.

The C1 result obtained from the RAM 765 may be stored in a register 770 that may be controlled by a control signal CNT6 772. In the next clock cycle, the RAM 765 may output C2 to a subtractor 775. Synchronously, the register 770 may present C1 to a subtractor 775 to provide for the calculation of C3 wherein C3 is equivalent to C2-C1. The difference of C2-C1 may be output from the subtractor 775 to a multiplier 780 that may be controlled by a control signal MLP2-en 782. The multiplier 780 may synchronously receive the difference of C2-C1 on one input and the output of $R^2$ [4:0] from the register 750 on the other input. Having received the two inputs, the multiplier 780 may multiply the two inputs and present the product to an adder 785. The other input of the adder 785 may receive a value of C1 and the adder 785 may add the product of $R^2[4:0]$ and C2-C1 to C1. The output of the adder 785 is the shading correction factor for the scanned pixel and it may be stored in a register 790 that is controlled by a clock signal clk 736. Due to an inherent delay in calculating the correction factor for the scanned pixel, a delay unit 793 may be used to delay a digital output from the scanned pixel until the calculation factor can be processed. In an aspect of the present invention, the delay unit 793 may be a pair of registers connected together to form a two clock delay.

In an alternative embodiment of the present invention, the multipliers 780 and 795 may be replaced by a single multiplier unit with two multiplexers at its inputs. In such an embodiment, a control device and/or signal may provide that the multiplexers provide inputs to the single multiplier to provide that during odd clock cycles the single multiplier receives an output from the register 750 of the $R^2[4:0]$ 752 and an output from the adder 775. Having received these inputs, the single multiplier multiplies the inputs together and presents the output of the multiplication to the register 790. Then at even clock signals the multiplexers present the output from the register 790 to the single multiplier and the single multiplier multiplies the input with the delayed-pixel output from the delay unit 793.

Figure 7B:
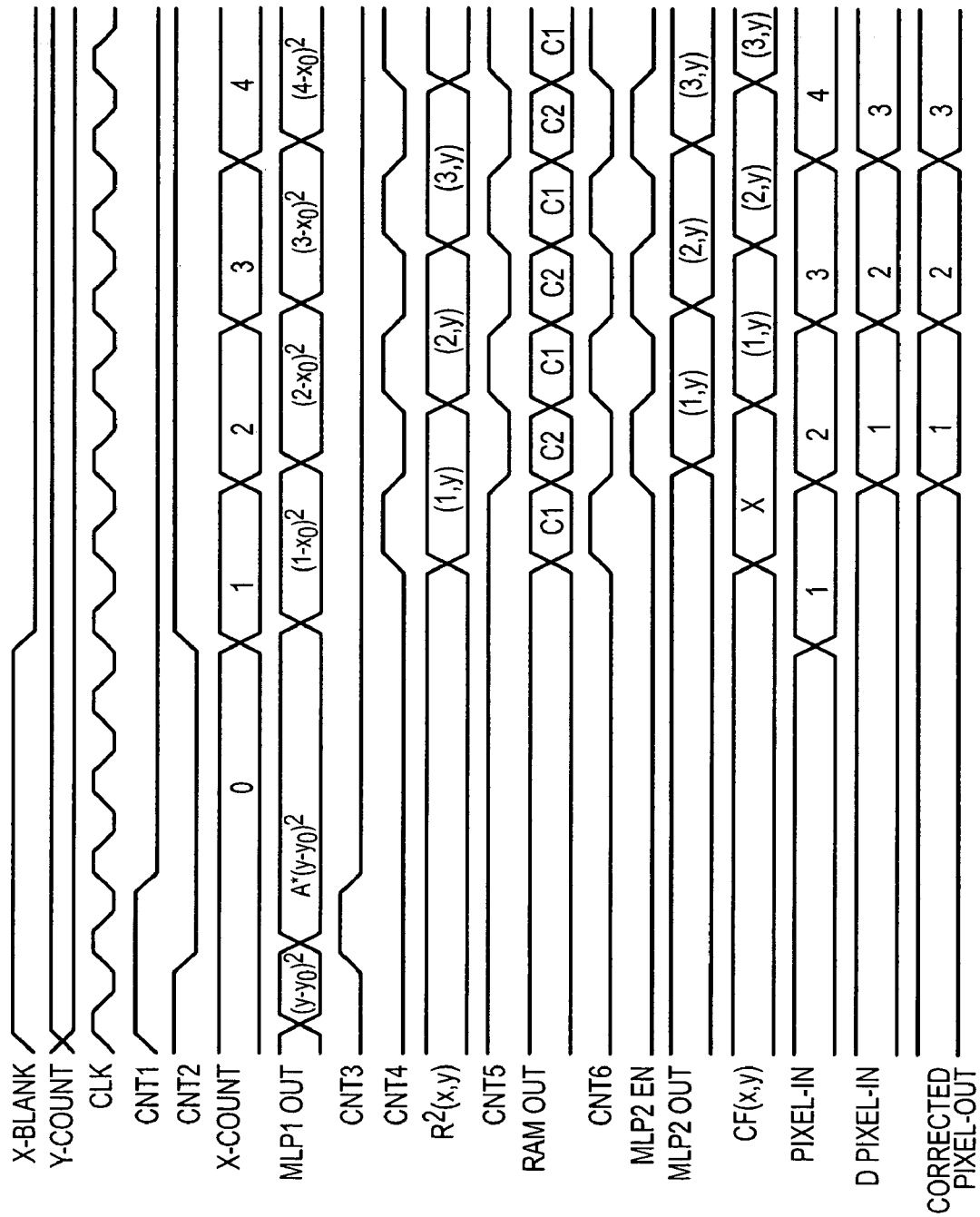
FIG. 7B illustrates timing waveforms for operation of the shading correction circuit according to an embodiment of the present invention shown in FIG. 6A.

FIG. 7B illustrates timing waveforms for operation of the shading correction circuit according to an embodiment of the present invention shown in FIG. 7A. FIG. 7B illustrates the timing waveforms for the signals described in FIG. 7A in accordance with an embodiment of the present invention.

Figure 8A:
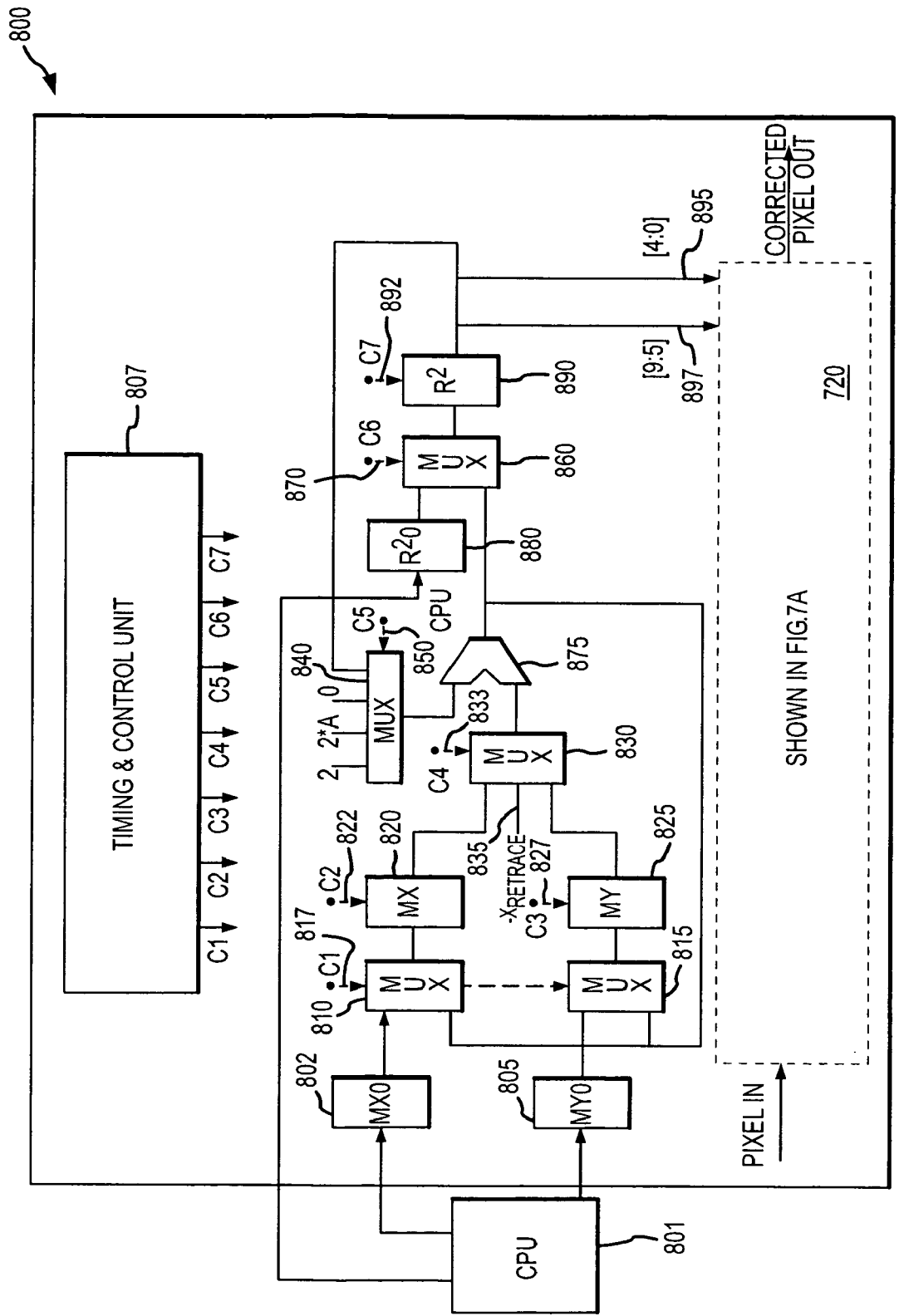
FIG. 8A illustrates a circuit for iteratively calculating $R^2$ and correcting a pixel output for shading effects in accordance with an embodiment of the present invention.

FIG. 8A illustrates a circuit for iteratively calculating $R^2$ and correcting a pixel output for shading effects in accordance with an embodiment of the present invention. In the embodiment, an iterative calculation circuit 800 may be used to iteratively calculate an elliptical-type equation for a pixel scanned on the image sensor array of an image sensor. The iterative calculation circuit may be combined with the correction function $F_2$ circuit 720 described in FIG. 7A to calculate a shading correction factor for the scanned pixel.

In an embodiment of the present invention, an initial value for MX may be determined for the image sensor and loaded from an external CPU 801 onto a MX0 register 802. The CPU 801 may be located on the same integrated circuit in some embodiments and/or in another integrated circuit in other embodiments. The CPU 801 may be a processor, processors and/or a software program executed on a processor. An initial value for MY may be determined for the image sensor and loaded from the external CPU 801 onto a MY0 register 805. Further, an initial value for $R^2$ may be determined for the image sensor and loaded from the external CPU 801 onto a $R^2$0 register 880. The outputs from the external CPU 801 may be loaded to the registers 802, 805 and 880 prior to the scanning of images on the image sensor.

In the illustrated embodiment, a timing and control unit 807 may control the operation of various circuits in the iterative calculation circuit 800. The timing and control unit 807 may be a processor, a software program, and/or a device controlled by a processor, such as CPU 801. As illustrated, the timing and control unit is shown providing control signals C1 through C7, but may produce additional or less control signals. For illustrative purposes, connection of the control signals to the devices controlled by the control signals is not pictured, but will be appreciated by persons of skill in the art. In the illustrated embodiment, a multiplexer 810 may be controlled by a control signal C1 817 provided by the timing and control unit 807. A second multiplexer 815 may also be controlled by the control signal C1 817. When the control signal C1 817 is high the a multiplexer 810 may route the value of the MX0 register 802 into an MX register 820. Concurrently, when the control signal C1 817 is high the multiplexer 815 may route the value of the MY0 register 805 into an MY register 825. When the C1 817 is low the multiplexers 810 and 815 may route an output from an adder 875 to the MX register 820 and the MY register 825. A control signal C2 822 controls when the MX register 820 receives an input. Similarly, a control signal C3 827 controls when the MY register 825 receives an input In the illustrated embodiment, a three-way multiplexer 830 may be controlled by a control signal C4 833 to route outputs from the MX register 820 and the MY register 825 or a pre-programmed value of a minus-Xretrace 835, where the Xretrace 835 may be equal to $(Xleft-X0)^2-(Xright-X0)^2$, to the adder 875. A four-way multiplexer 840 may be controlled by a four-state control signal C5 850. The four way multiplexer 840 may be used to provide inputs to the adder 875. The four-way multiplexer 840 may be used to present a constant value of 2, a programmable value 2*A, a constant value of 0, or the current value of $R^2$ stored in a register 890, to the top input of the adder 875, depending upon the state of the control signal C5 850.

In the illustrated embodiment, the adder 875 may provide outputs to the multiplexer 810, the multiplexer 815 and a multiplexer 860. The multiplexer 860 may be controlled by a control signal C6 870 to select an output from either the adder 875 or the $R^2$0 register 880 for presentation to the input of a $R^2$ register 890. The output of the $R^2$ register 890 may be controlled by a control signal C7 892 and the output may be divided to a low order part 895 and a high order part 897. The output from the $R^2$ register 890 may be fed to the correction function $F_2$ circuit 720 and applied to function $F_2$ in the manner described with regard to FIG. 7A to obtain a shading correction factor for the scanned pixel. The control signals C1, C2, C3, C4, C5, C6 and C7 may be generated by the timing and control unit 807.

In embodiments of the present invention, the following operations may be done during the horizontal blank period (X-Blank):

$R^2(x,y+1)=R^2(X,Y)+MY(Y)$
$R^2(Xright,Y)=R^2(Xleft,Y)-Xretrace$
$MY(Y+1)=MY(Y)+2*A$
$MX=MX0$ Further, in the first clock cycle, when X-Blank goes high, the control signal C1 810 may go high, routing an output from the MX0 register 802 to the MX register 820, and also routing an output from the MY0 register 805 to the MY register 825. At the end of the first clock cycle C2 may go high to provide that an output from the MX0 register 802 may be presented to the MX register 820. When the control signal C3 827 is low the value of the MY register 820 will remain the same. Further, during the first clock cycle, the control signal C4 833 may be at state Xretrace to provide that the preprogrammed value of Xretrace, where Xretrace=$(Xright-X0)^2-(Xleft-X0)^2$, may be routed to the adder 875. Synchronously to this input to the adder 875, the control signal C5 850 may be at state $R^2$ to provide that the adder 875 may generate an x-retrace corrected value of R2 that may be subsequently loaded into the $R^2$ register 890 at the next clock cycle, when the control signal C7 892 goes high.

During the second clock cycle, the control signal C4 833 may be set to an MY state and provide for the routing of the output from the MY register 825 through the multiplexer 830 to the bottom input of the adder 875. The control signal C5 850 may remain at the $R^2$ state for the second clock cycle and the adder 875 may generate a sum of $R^2$+MY. This output may then be routed through the multiplexer 860 to the $R^2$ register 890. During the next clock cycle the control signal C7 892 may remain high to provide for the storing of $R^2$+MY on the $R^2$ register 890.

During the third clock cycle, the control signal C5 850 may be set to the 2*A state and provide that the multiplexer 840 routes the pre-programmed value of 2*A to the upper input of the adder 875. During the third clock cycle, the control signal C4 833 may remain at the MY state to provide that the MY value is presented to the bottom input of the adder 875. By presenting the MY to the bottom input of the adder 875 during the third clock signal it may be provided that the adder 875 may generate MY+2*A. Consequently, the value MY+2*A may be routed from the adder 875 through the multiplexer 815 to the MY register 825. During the next clock cycles the control signal C3 827 may go high to provide that the value MY+2*A may be loaded to the MY register 825.

In some embodiments, from the fourth clock cycle and until X-blank ends, in preparation of the scanning of first pixels of a new line on the image sensor array, the control signal C4 833 may stay in the MX state and the control signal C5 850 may stay in the $R^2$ state to provide that the adder 875 may output a value of MX+$R^2$. Under the same conditions, after the first pixel of a new line is scanned the adder 875 may output a value of $R^2$.

In some embodiments, the following operations may take place when new pixels on a line are scanned:

$R^2(x+1,y)=R^2(x,y)+MX(x)$
$MX(x+1)=MX(x)+2$

When a new pixel is scanned, the control signal C4 833 may be at state MX until the end of the line is scanned. As such, the control signal C4 833 may provide that the value of MX is presented to the bottom input of the adder 875. As new pixels are scanned, the control signal C5 850 may alternate between the value of $R^2$ and the integer value 2 and provide that the adder 875, in turn, alternately generates MX+2 and $R^2$+MX. By keeping the control signal C1 817 low at this time the value of MX+2 generated by the adder 875 may be routed through the multiplexer 810 to the MX register 820 and may be latched there by the control signal C2 822. For the succeeding pixels, the $R^2$+MX values generated by the adder 875 that are equivalent to the $R^2$ values may be latched in the $R^2$ register 890 by the control signal C7 892.

Figure 8B:
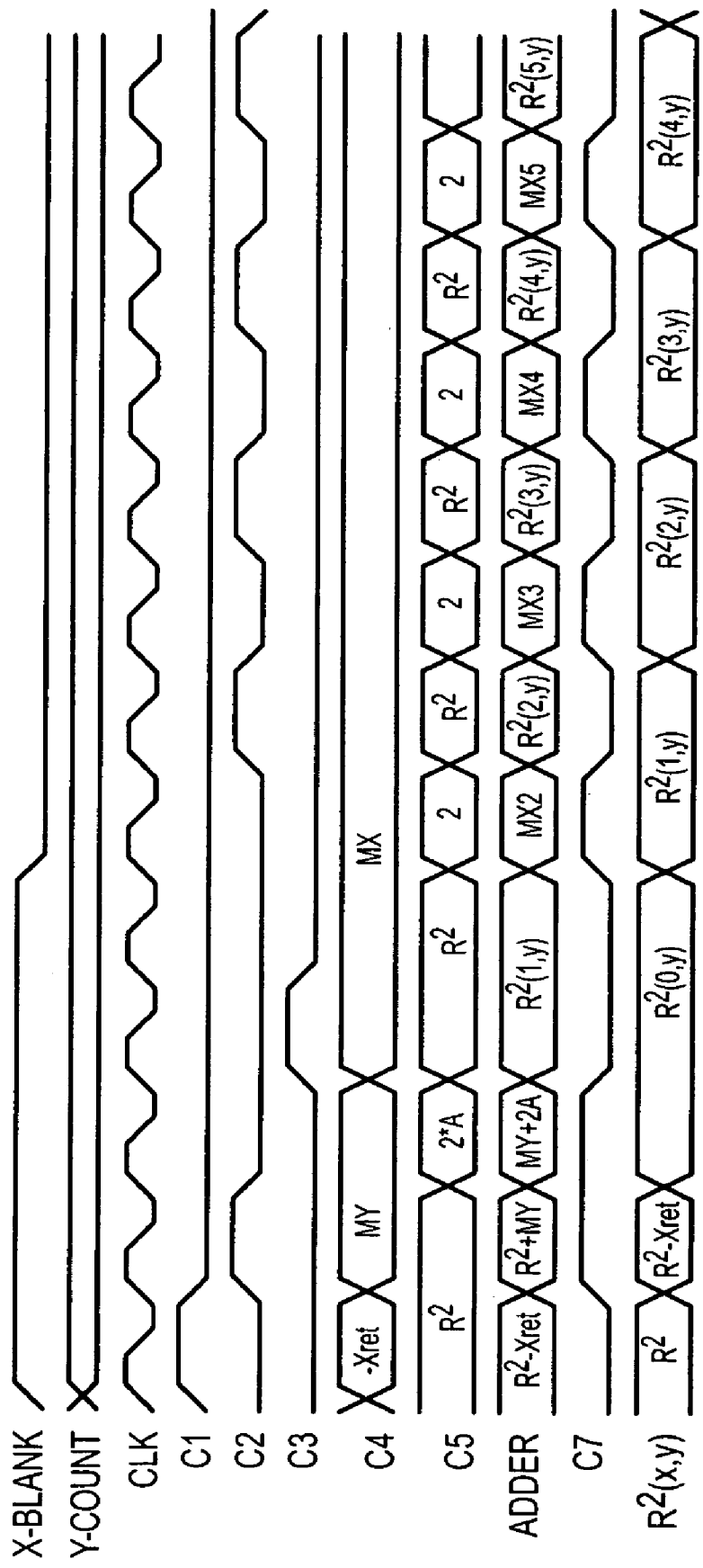
FIG. 8B illustrates timing waveforms for scanning an image sensor and controlling the circuit for iteratively calculating $R^2$ and correcting a pixel output for shading effects in accordance with an embodiment of the present invention.

FIG. 8B illustrates timing waveforms for scanning an image sensor and controlling the circuit for iteratively calculating $R^2$ and correcting a pixel output for shading effects in accordance with an embodiment of the present invention. FIG. 8B illustrates the timing waveforms discussed above for operating the circuits illustrated in FIG. 8A in accordance with an embodiment of the present invention.

In some embodiments of the present invention, the systems and methods described above for calculating either directly or iteratively, radial functions for an image sensor, that may be functions of circular-type or elliptical-type equations, may be used to define radial regions on the image sensor in the Bayer domain. In embodiments of the present invention, limitations may be applied to the circular-type and/or elliptical-type equations to provide for the identification of radial regions on the image sensor. Merely by way of example, a function of a circular-type equation may be provided with functional limitation factors to provide a zero (0) value when radial component, R or R2, is below a certain value, wherein R and/or R2 may be calculated for the function using the processes described above either directly, using look up tables, iteratively, and/or the like. The zero value output from the function may be fed to an image processing system, color processing system, and/or the like to provide for image processing variations according to radial location on the image sensor in the Bayer domain. Such image processing in the Bayer domain may provide for creating a wide-variation of special effects, image processing and/or the like that may be directly derived from pixel outputs from the image sensor. Merely by way of example, color processing of pixel outputs may be turned off when the output from the function is zero or below a threshold value. In this way, selected regions of an image produced by the image sensor may be gray or colorless. In certain aspects, the function may be used to provide for the output of a gray circle at the center of the image that may indicate where auto-focusing of a camera, video camera or the like incorporating the image sensor is focusing. With different limitations on the functions of circular and/or elliptical type equations different regions on the image sensor may be identified for processing of pixel outputs in these regions prior to demosaicing.

The invention has now been described in detail for purposes of clarity of understanding. However, it would be appreciated that certain changes and modifications may be practiced within the scope of the appended claims.

What is claimed is:

1. An image processing system for dynamically correcting shading effects in pixel outputs in an image sensor based upon radial pixel location performed prior to demosaicing processing, comprising:

an image sensor, wherein the image sensor comprises at least a pixel array, an array of micro-lenses, and an array of color filters, and wherein the image sensor is optically coupled to a lens, the array of color filters comprises at least a plurality of first color filters, a plurality of second color filters and a plurality of third color filters, the plurality of first color filters, the plurality of second color filters and the plurality of third color filters are arranged in a mosaic pattern, and each pixel in the pixel array is associated with a one of the color filters;

means for scanning an analog output from a pixel on the pixel array, wherein the image scanning means is configured to obtain outputs from each pixel in the pixel array;

means for converting the analog output from the scanned pixel to a digital output;

means for processing a radial location for the scanned pixel, wherein the radial location is determined relative to a reference location on the pixel array;

means for calculating a correction factor for the shading effect for the scanned pixel, wherein the calculating means calculates the correction factor by applying the radial location to a correction function, and the correction function is a function of an elliptical-type equation that varies radially and the correction function including a multiplication factor, the multiplication factor being calculated from at least a first and a second constant, the first and second constants being dependent upon wavelength transmissibility of the color filter associated with the scanned pixel and dimensions of the pixel array; and means for correcting the digital output with the correction factor.

2. The image processing system for dynamically correcting shading effects in pixel outputs in the image sensor based upon radial pixel location performed prior to demosaicing processing as recited in claim 1, wherein the image sensor is a CMOS image sensor.

3. The image processing system for dynamically correcting shading effects in pixel outputs in the image sensor based upon radial pixel location performed prior to demosaicing processing as recited in claim 1, wherein the reference location is an optical center of the pixel array.

4. The image processing system for dynamically correcting shading effects in pixel outputs in the image sensor based upon radial pixel location performed prior to demosaicing processing as recited in claim 3, wherein the optical center of the pixel array is ascertained by using a light source to uniformly illuminate the image sensor.

5. The image processing system for dynamically correcting shading effects in pixel outputs in the image sensor based upon radial pixel location performed prior to demosaicing processing as recited in claim 1, wherein the reference location is a physical center of the pixel array.

6. The image processing system for dynamically correcting shading effects in pixel outputs in the image sensor based upon radial pixel location performed prior to demosaicing processing as recited in claim 1, further comprising:

memory means for storing the reference location; and retrieval means for retrieving the reference location stored on the memory means, wherein the retrieved reference location is used by the processing means to process the radial location of the scanned pixel.

7. The image processing system for dynamically correcting shading effects in pixel outputs in the image sensor based upon radial pixel location performed prior to demosaicing processing as recited in claim 1, wherein the plurality of the first color filters comprises a plurality of red filters, the plurality of the second color filters comprises a plurality of green filters, the plurality of the third color filters comprises a plurality of blue filters, and the mosaic pattern comprises a Bayer pattern.

8. An image processing system for dynamically correcting shading effects in pixel outputs in the image sensor based upon radial pixel location performed prior to demosaicing processing, comprising:

an image sensor, wherein the image sensor comprises at least a pixel array, an array of micro-lenses, and an array of color filters, and wherein the image sensor is optically coupled to a lens;

the array of color filters comprises at least a plurality of first color filters, a plurality of second color filters and a plurality of third color filters;

the plurality of first color filters, the plurality of second color filters and the plurality of third color filters are arranged in a mosaic pattern; and each pixel in the pixel array is associated with a one of the color filters; means for scanning an analog output from a pixel on the pixel array, wherein the image scanning means is configured to obtain outputs from each pixel in the pixel array; means for converting the analog output from the scanned pixel to a digital output;

means for processing a radial location for the scanned pixel, wherein the radial location is determined relative to a reference location on the pixel array;

means for calculating a correction factor for the shading effect for the scanned pixel, wherein the calculating means calculates the correction factor by applying the radial location to a correction function; and the correction function is a function of an elliptical-type equation that varies radially; and means for correcting the digital output with the correction factor, wherein the radial location is described in two-dimensional cartesian coordinates comprising an x-coordinate measured on an x-axis from the reference location and a y-coordinate measured on a y-axis from the reference location, the correction function comprises a function of a square root of a square of the x-coordinate summed with a square of the y-coordinate multiplied by a multiplication factor, the multiplication factor is calculated from at least a first and a second constant, and the first and the second constants are dependent upon wavelength transmissibility of the color filter associated with the scanned pixel and dimensions of the pixel array.

9. A system for digitally correcting shading effects at a Bayer domain in an image sensor using radial pixel location, comprising:

a lens;

a CMOS image sensor optically coupled to the lens, wherein the CMOS image sensor comprises at least, an array of color filters positioned underneath the lens, wherein the array of color filters comprises a plurality of red filters, a plurality of blue filters and a plurality of green filters arranged in a Bayer pattern, and a pixel array comprising a plurality of pixels positioned beneath the color filters and configured to receive light that passes through the lens and the array of color filters;

a control unit in communication with the pixel array and configured to select an analog output from a pixel in the pixel array, wherein the control unit is configured to scan outputs from each of the plurality of pixels, and the pixel is associated with a one of the color filters;

an analog to digital converter configured to receive the analog output from the selected pixel and to convert the analog output to a digital output;

a processor in communication with the analog to digital converter and configured to receive the digital output and to correct the digital output for the shading effects, wherein the processor is configured to process a relative radial location of the pixel on the pixel array relative to a reference point on the pixel array, the processor is configured to calculate a shading correction factor for the pixel by applying a correction function to the relative radial location, the correction function is a function of a one of a circular-type equation that varies radially and an elliptical-type equation that varies radially and the correction function including a multiplication factor, the multiplication factor being calculated from at least a first and a second constant, the first and second constants being dependent upon wavelength transmissibility of the color filter associated with the scanned pixel and dimensions of the pixel array, and the processor is configured to calculate a corrected digital output by applying the shading correction factor to the digital output.

10. The system for digitally correcting shading effects at the Bayer domain in the image sensor using radial pixel location as recited in claim 9, wherein the reference point is an optical center of the pixel array.

11. The system for digitally correcting shading effects at the Bayer domain in the image sensor using radial pixel location as recited in claim 9, wherein the reference point is a physical center of the pixel array.

12. The system for digitally correcting shading effects at the Bayer domain in the image sensor using radial pixel location as recited in claim 9, further comprising a memory in communication with the processor, wherein the memory is configured to store at least one calculated value of a part of the correction function for the reference point, and the processor is configured to retrieve the at least one calculated value from the memory and to iteratively calculate the shading correction factor for the pixel using the at least one calculated value and the relative radial location.

13. The system for digitally correcting shading effects at the Bayer domain in the image sensor using radial pixel location as recited in claim 12, wherein the memory comprises at least one register, and the processor comprises a combination of at least one multiplexer, at least one adder, and at least one multiplier.

14. The system for digitally correcting shading effects at the Bayer domain in the image sensor using radial pixel location as recited in claim 9, wherein the relative radial location is described in two-dimensional Cartesian coordinates, wherein the Cartesian coordinates comprise an x-coordinate measured on an x-axis from the reference point and a y-coordinate measured on a y-axis from the reference point, and the correction function comprises a function of a square root of a square of the x-coordinate summed with the square of the y-coordinate multiplied by the multiplication factor.

15. A method for digitally correcting shading effects at a Bayer domain in a CMOS image sensor using radial pixel location, comprising:

providing a lens;

providing said CMOS image sensor, wherein said CMOS image sensor is optically coupled to said lens and comprises at least, an array of color filters located underneath the lens, wherein the array of color filters comprises at least a plurality of first color filters, a plurality of second color filters and a plurality of third color filters and wherein the plurality of the first color filters, the plurality of the second color filters and the plurality of the third color filters are arranged in a mosaic pattern, and an array of photo-sensitive elements located underneath the array of color filters and configured to receive light passing through the lens and the array of color filters, wherein the array of photo-sensitive elements comprises at least a plurality of first photo-sensitive elements each associated with each of said first color filters, a plurality of second photo-sensitive elements each associated with each of said second color filters and a plurality of third photo-sensitive elements each associated with each of said third color filters;

identifying a center point of the array of the photo-sensitive elements;

determining first radial locations for each of the plurality of the first photo-sensitive elements relative to the center point;

calculating first correction factors for each of the plurality of the first photo-sensitive elements, wherein the first correction factors are based on a multiplication factor and are calculated from the first radial locations, the multiplication factor being calculated from at least a first and a second constant, the first and second constants being dependent upon wavelength transmissibility of the first color filter associated with the photo-sensitive element and dimensions of the array of photo-sensitive elements; and using the first correction factors to correct digitally converted outputs from each of the plurality of the first photo-sensitive elements at the Bayer domain.

16. The method for digitally correcting shading effects at the Bayer domain in the CMOS image sensor using radial pixel location as recited in claim 15, wherein the first correction factors are calculated from a first function and the first function is a function of an elliptical-type equation that varies radially.

17. The method for digitally correcting shading effects at the Bayer domain in the CMOS image sensor using radial pixel location as recited in claim 16, wherein the second constants are in the first function.

18. The method for digitally correcting shading effects at the Bayer domain in the CMOS image sensor using radial pixel location as recited in claim 16, wherein the first constants are in the first function.

19. The method for digitally correcting shading effects at the Bayer domain in the CMOS image sensor using radial pixel location as recited in claim 18, wherein, the first constants are calculated by illuminating the CMOS image sensor with a uniform light source and registering responses from a first sample of the first photo-sensitive elements.

20. The method for digitally correcting shading effects at the Bayer domain in the CMOS image sensor using radial pixel location as recited in claim 15, wherein the digitally corrected outputs are converted to a YUV signal.

21. The method for digitally correcting shading effects at the Bayer domain in the CMOS image sensor using radial pixel location as recited in claim 15, wherein the center point is an optical center of the array of photo-sensitive elements, and the optical center is determined from optical properties of the lens.

22. The method for digitally correcting shading effects at the Bayer domain in the CMOS image sensor using radial pixel location as recited in claim 21, wherein the optical center is determined by uniformly illuminating the CMOS image sensor to determine a location with a highest output.

23. The method for digitally correcting shading effects at the Bayer domain in the CMOS image sensor using radial pixel location as recited in claim 15, wherein the center point is a physical center of the of the photo-sensitive elements.

24. A method for dynamically correcting shading effects in a CMOS image sensor using radial pixel location performed prior to demosaicing processing, comprising:

providing said CMOS image sensor, wherein said CMOS image sensor is optically coupled to a lens and comprises at least an array of color filters located underneath the lens, wherein the array of color filters comprises at least a plurality of first color filters, a plurality of second color filters and a plurality of third color filters and wherein the plurality of the first color filters, the plurality of the second color filters and the plurality of the third color filters are arranged in a mosaic pattern, and an array of photo-sensitive elements located underneath the array of color filters and configured to receive light passing through the lens and the array of color filters, wherein the array of photo-sensitive elements comprises at least a plurality of first photo-sensitive elements each associated with each of said first color filters, a plurality of second photo-sensitive elements each associated with each of said second color filters and a plurality of third photo-sensitive elements each associated with each of said third color filters;

identifying a reference location on the array of photo-sensitive elements; using a first processor to calculate initial values for the reference location, wherein the initial values are calculated from components of a radial correction function using location information of the reference location, and the radial correction function is a function of one of a circular-type equation and an elliptical-type equation, the radial correction function including a multiplication factor, the multiplication factor being calculated from at least a first and a second constant, the first and second constants being dependent upon wavelength transmissibility of the color filter associated with a scanned photo-sensitive element and dimensions of the array of photo-sensitive elements;

storing the initial values in a memory;

scanning from the reference location across the array of the photo-sensitive elements to a first photo-sensitive element and retrieving first location information and a first digitally converted output from the first photo-sensitive element, wherein the first digitally converted output corresponds to illumination incident upon the first photo-sensitive element, and the first location information identifies a first location of the first photo-sensitive element relative to the reference location;

using a second processor to iteratively calculate a first correction factor for the first photo-sensitive element from the radial correction function, wherein the iterative calculation is calculated from the initial values and the first location information; and using the first correction factors to digitally correct the first digitally converted output.

25. The method for dynamically correcting shading effects in the CMOS image sensor using radial pixel location performed prior to demosaicing processing as recited in claim 24, wherein the reference point is an optical center of the photo-sensitive element array.

26. The method for dynamically correcting shading effects in the CMOS image sensor using radial pixel location performed prior to demosaicing processing as recited in claim 24, wherein the reference point is a physical center of the photo-sensitive element array.

27. The method for dynamically correcting shading effects in the CMOS image sensor using radial pixel location performed prior to demosaicing processing as recited in claim 24, wherein the reference point is a one of an optical center of the array of the photo-sensitive elements and a physical center of the array of the photo-sensitive elements; and the reference location is identified in two-dimensional cartesian coordinates as having location information x=O, y=O.

28. The method for dynamically correcting shading effects in a CMOS image sensor using radial pixel location performed prior to demosaicing processing as recited in claim 24, wherein color correction of the first digitally converted output is turned off when at least one of the first correction factors is below a threshold value.

* * * * *